COMPOUND CHANNEL INSULATED GATE TRIODE

Filed Dec. 20, 1966 Sheet 1 of 2

INVENTOR
RAYMOND M. WARNER, JR.
E. Mickey Hubbard
ATTORNEY

INVENTOR
RAYMOND M. WARNER, JR.
E. Mickey Hubbard
ATTORNEY

1

3,436,622
COMPOUND CHANNEL INSULATED GATE TRIODE

Raymond M. Warner, Jr., Dallas, Tex., assignor to Texas Instruments Incorporated, Dallas, Tex., a corporation of Delaware Filed Dec. 20, 1966, Ser. No. 603,335
Int. Cl. H01l *11/00*
U.S. Cl. 317—235 6 Claims

ABSTRACT OF THE DISCLOSURE

This invention relates to insulated gate field effect transistor devices and specifically discloses the use of metal-oxide-semiconductor field effect transistor devices connected in series upon a single chip each transistor having a common gate and operating in the enhancement mode. The dimensions of the respective channels are controlled to provide the field effect transistor nearest the power supply with a larger transconductance so as to flatten the current voltage characteristics of the series and provide what is termed a compound channel triode.

This invention relates generally to metal-oxide-semiconductor (MOS) field effect transistor (FET) devices, and more particularly relates to an enhancement-mode MOS triode having an increased output impedance and a higher gain.

Several workers in the art have concerned themselves with the properties of various cascade arrangements of junction-type FET devices. In these arrangements, the channels of a pair of FETs are connected in series by connecting the source of the first FET to the drain of the second. The drain of the first FET is connected to a drain voltage supply, and the source of the second FET is connected to a source voltage supply. The gate of the first FET is also connected back to the source of the second FET to provide feedback, and the gate of the second FET is the input of the compound configuration. The first FET is selected to have a higher pinch-off current than the second. Then as voltage is increased on the drain of the first FET, the second FET initially has a greater voltage drop from source to drain than does the first FET. However, the voltage drop from source to drain of the second FET constitutes the gate bias on the first FET. Thus, as the drain voltage on the first FET is increased while holding the input voltage constant, a point is reached where the current through the first FET is pulled down to a level approximately equal to the pinch-off current of the second FET. Then any further tendency for the voltage drop across the second FET to increase biases the gate of the first FET more heavily and thus reduces the current through the second FET. As a result, the drop across the second FET can increase only slightly from this point due to the gain of the first FET which absorbs most of the remainder of the voltage applied from drain to source of the composite configuration. The consequence of this interaction is a marked flattening of the output characteristics of the device.

All efforts to date in this field are believed to have been directed toward junction-type and depletion-mode MOS field effect transistors. This invention is concerned with achieving a similar effect with enhancement-mode MOS transistors. The circuit configuration previously described does not apply to enhancement-mode MOS devices because the presence of a drop in the second MOS FET would place the gate of the first MOS FET at a voltage which would permit no conduction.

In accordance with the present invention, the compound-channel MOS triode comprises a pair of enhance-

2 ment-mode channels connected in series, with the source of the first connected to the drain of the second. The drain of the first channel and the source of the second channel constitute the drain and source of the compound-channel triode. The gates of the two channels are electrically common, as are the back gates or substrates. The first channel has a greater transconductance and a greater "saturation" current at a particular set of identical bias voltages than the second channel.

In accordance with another important aspect of the invention, the two channels are fabricated on a common substrate and the different transconductance values achieved by differences in the width-to-length ratios of the channels.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
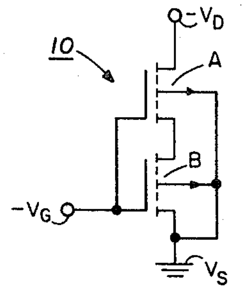
FIGURE 1 is a schematic circuit diagram of a compound-channel MOS triode constructed in accordance with the present invention.

Referring now to the drawings, a compound-channel MOS triode constructed in accordance with the present invention is indicated generally by the reference numeral 10 in the schematic diagram of FIGURE 1. The present invention is applicable to either a p-channel or n-channel enhancement-mode MOS device, the only difference being that the polarities of the various voltages involved are changed. For convenience, however, only p-channel devices will herein be described. The compound-channel triode 10 comprises first and second enhancement-mode channels A and B, respectively. The source of the first channel A is electrically common with the drain of the second channel B. The drain of the first channel A forms the drain of the compound-channel triode and the source of channel B forms the source of the compound-channel triode. The control gates of the two channels A and B are electrically common and form the input for the compound-channel triode. Similarly, the substrate portions of each of the channels, which forms a back gate for each channel, are common with the source terminal of the compound-channel triode. The transconductance, and hence the "saturation current" at a particular set of bias voltages, of the first channel A exceeds the transconductance of the second channel B at the given gate bias voltage, preferably by a substantial amount.

If the conductances of the individual channels A and B are $G_A$ and $G_B$, respectively, at a given gate bias greater than the threshold voltage, then the conductance of the compound-channel triode 10 may be represented by the following expression at lower drain voltages:

$$\frac{G_A G_B}{G_A + G_B} \quad (1)$$

As the drain voltage is increased in the proper direction, i.e., negatively for a p-channel device and positively for an n-channel device, Expression 1 will initially hold. However, as a voltage drop develops from source to drain across channel B, the gate bias on channel A, which is the source-to-gate voltage, will decrease. It will be noted that the bias on the back gate or substrate of channel A is also affected by the voltage drop in channel B and that the effects of the bias on the control gate and the back gate are additive. Therefore, as the drain voltage increases and the gate bias of channel A decreases, the conductance of channel A will decrease markedly. Then as channel B approaches the saturation region, the voltage drop from source to drain of channel A will increase at a much greater rate than the voltage from source to drain of channel B. As a result, the current through the compound-channel triode increases at a substantially slower rate with an increase in the drain voltage than would be the case for either channel A or B, individually. This means that the output impedance of the compound-channel triode is materially increased.

Figure 2:
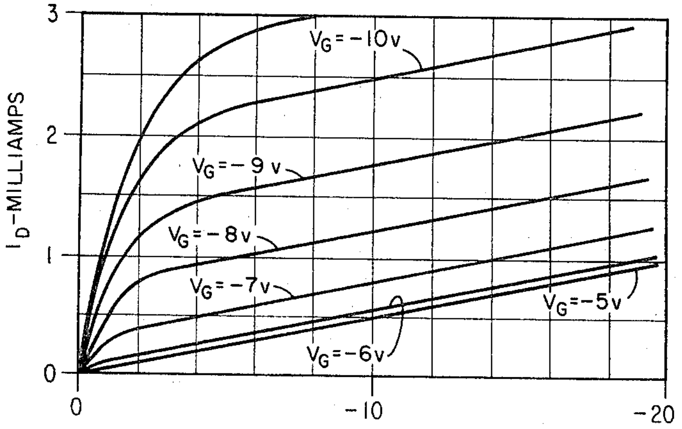
FIGURE 2 is a plot of drain current with respect to drain voltage of one of the channels of the device illustrated in FIGURE 1 for various voltages applied to the control gate of the channel.
Figure 3:
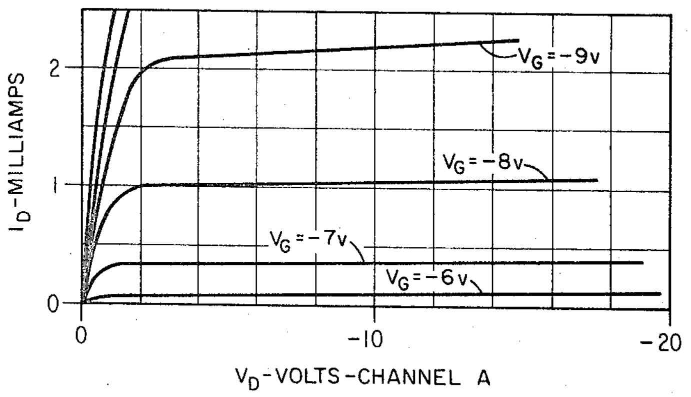
FIGURE 3 is a plot similar to FIGURE 2 of drain current with respect to drain voltage of the other channel of the device of FIGURE 1 for various voltages applied to the control gate of the channel.
Figure 4:
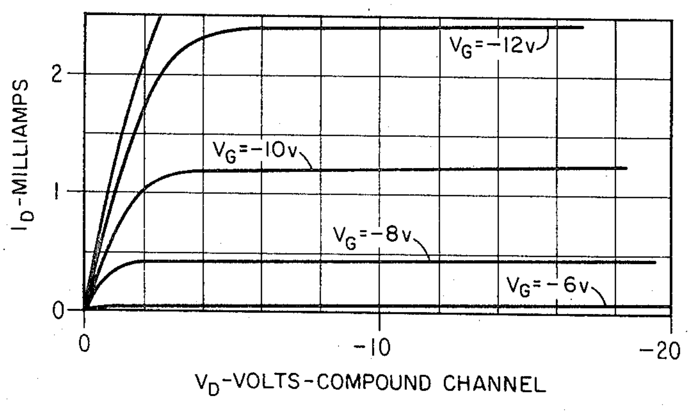
FIGURE 4 is a plot similar to FIGURES 2 and 3 of drain current with respect to drain voltage of the compound-channel triode of FIGURE 1 for various voltages applied to the common control gate.

In one embodiment of the invention, two discrete MOS transistors were connected in the configuration illustrated in FIGURE 1. The transistor corresponding to channel A exhibited the current-voltage characteristics illustrated in FIGURE 3, and the transistor corresponding to channel B exhibited the current-voltage characteristics illustrated in FIGURE 2. The compound channel triode resulting from the interconnection of the two MOS transistors exhibited the current-voltage characteristics illustrated in FIGURE 4. It will be readily noted that the curves in FIGURE 4 of the compound channel triode are significantly flatter than the corresponding curves of either of the individual devices as illustrated by the curves of FIGURES 2 and 3.

The saturation current $I_D$ of a conventional MOS triode can be represented by the equation:

$$I_D = \frac{\mu \epsilon}{2\Delta} \frac{W}{L} (V_G - V_T)^2 \quad (2)$$

where:

$\mu$ is the carrier mobility,
$\epsilon$ is the dielectric constant of the gate insulator,
$\Delta$ is the thickness of the gate insulator,
W is the channel width, i.e., the plan view dimension normal to current flow,
L is the channel length, i.e., the plan view dimension parallel to current flow,
$V_G$ is the gate voltage with respect to the source, and
$V_T$ is the threshold voltage, i.e., the gate voltage at which the channel first begins to conduct.

From Expression 2, it will be noted that the saturation current, and hence the transconductance of channel A, can be made greater than that of channel B by either providing channel A with a greater width-to-length ratio $W/L$, or by providing channel A with a thinner insulating layer as represented by the term $\Delta$. A thinner insulating layer also decreases the threshold voltage $V_T$, thus increasing the value of the quantity in the brackets, which is squared. The triode is preferably fabricated on a common substrate using a geometry which will provide channel A with a greater transconductance than channel B at a result of a greater width-to-length ratio.

Figure 5:
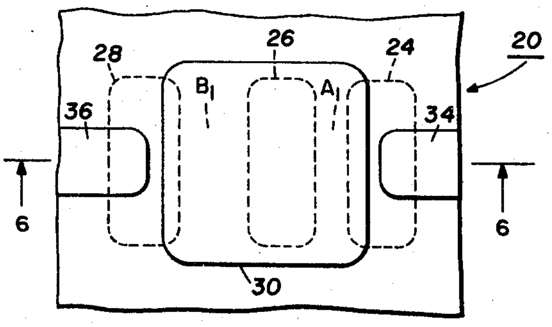
FIGURE 5 is a plan view of an embodiment of the device illustrated schematically in FIGURE 1 fabricated on a common substrate.
Figures 6, 7:
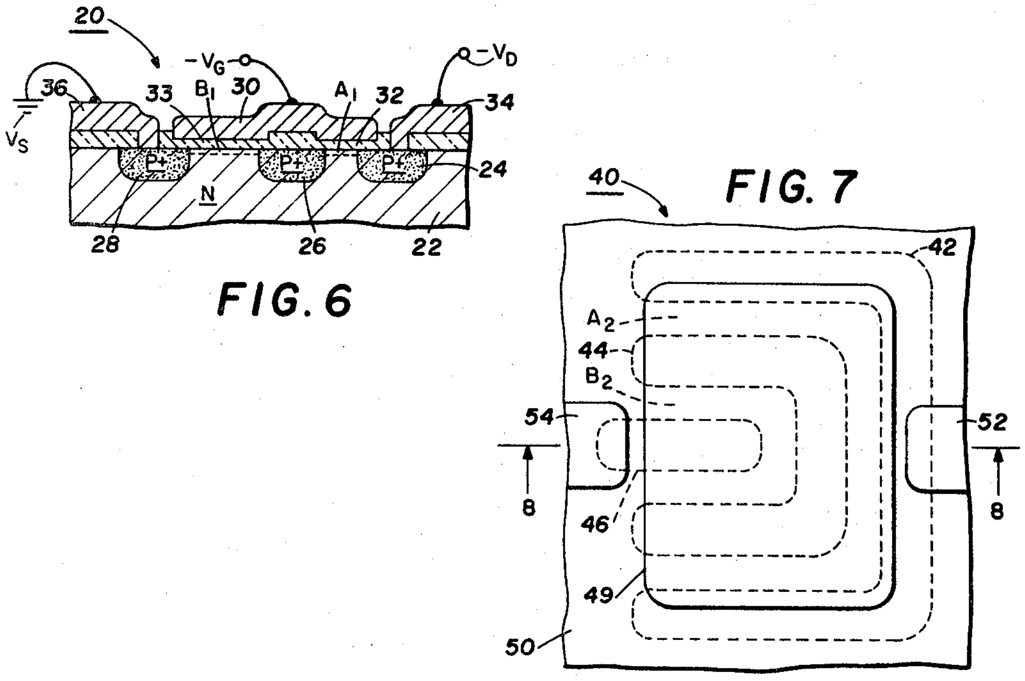
FIGURE 6 is a sectional view taken substantially on lines 6—6 of FIGURE 5.
FIGURE 7 is a plan view of another embodiment of the compound-channel triode illustrated in FIGURE 1 which is also fabricated on a common substrate.

A triode constructed in accordance with this invention which provides a greater transconductance in channel A as a result of an increased width-to-length ratio is indicated generally by the reference numeral 20 in FIGURES 5 and 6. The device 20 comprises first and second p-type enhancement-mode channels $A_1$ and $A_2$, as indicated by the dotted lines, formed in an n-type substrate 22 between three spaced, heavily doped p-type regions 24, 26 and 28. A metal control gate 30 is formed over channels $A_1$ and $B_1$ and is insulated from the channels by dielectric layers 32 and 33, respectively, of the same thickness. A drain terminal 34 is in ohmic contact with diffused region 24, and a source terminal 36 is in ohmic contact with diffused region 28. It will be noted that channels $A_1$ and $B_1$ have the same width, that is, the plan view dimension normal to the direction of current flow. However, the length, that is, the plan view dimension parallel to current flow, of channel $B_1$ is approximately twice that of channel $A_1$. Therefore, the width-to-length ratio of channel A is approximately twice the width-to-length ratio of channel B, as would be its transconductance.

Figure 8:
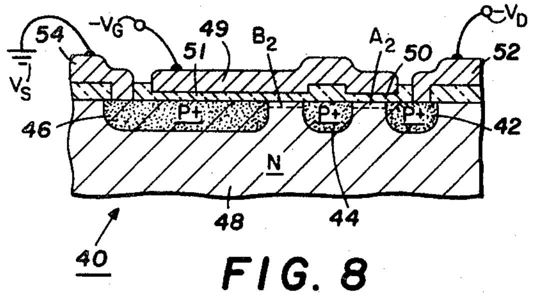
FIGURE 8 is a sectional view taken substantially on lines 8—8 of FIGURE 7.

Another compound-channel MOS triode constructed in accordance with the present invention wherein the difference in transconductance is provided by a difference in the width-to-length ratios is indicated generally by the reference numeral 40 in FIGURES 7 and 8. The device 40 comprises channels $A_2$ and $B_2$ formed between heavily doped, p-type diffused regions 42, 44 and 46 in an n-type substrate 48. A common metal control gate 49 is formed over both channels $A_2$ and $B_2$ and is electrically insulated from the channels by an insulating layer 50 and layer 51, respectively, of the same thickness. A drain terminal 52 is in ohmic contact with diffused region 42, and a source terminal 54 is in ohmic contact with diffused region 46. In the device 40, the length of channel $A_2$ is equal to the length of channel $B_2$, but the width of channel $A_2$ is approximately twice the width of channel $B_2$ so that channel $A_2$ has a substantially higher transconductance for any given gate bias voltage and source and drain voltages.

As mentioned, the difference in transconductance between channels A and B can also be achieved by varying the thickness of the insulating layer separating the common gate from each of the channels. The lengths of the channels can then be the smallest value that technology permits, and the widths of the channels can be equal. As a result, the intermediate heavily doped p-type diffused region can be eliminated. This combination of factors means that the device can then occupy substantially less area for a given performance. However, the device then has the disadvantage of requiring greater processing complexity in order to achieve the two insulating layers having different thicknesses. The intermediate diffused regions 26 and 44 can also be eliminated to achieve a smaller device, if desired, by making the insulating layer 32 thinner along the junction between the two channels. Then the channel induced by the gate electrode overlying the thinner oxide will produce an enhanced channel of greater depth which will simulate the diffused region and provide a relatively low resistance path at the junction between the channels.

The triode devices 20 and 40 may be fabricated using any conventional process for fabricating MOS transistor devices. Although the back gates of the channels are illustrated as common with the source of channel B, in some integrated circuit applications, such as when the device is used as a load for an amplifier, the back gates may not be common with the source.

Although preferred embodiments of the invention have been described in rather specific detail, it is to be understood that various changes, substitutions and alterations can be made therein without departing from the spirit and scope of the invention as defined by the appended claims.

What is claimed is:

1. A compound channel insulated gate triode comprising first and second enhancement mode channels formed on a common substrate, each channel having a drain and a source end and a control gate separated from the channel by an insulating layer, the first channel having a greater transconductance than the second channel at a given gate bias, said greater transconductance being produced by the width to length ratio of the first channel being greater than the width to length ratio of the second channel, the drain of the first channel being the drain of the triode, the source of the first channel being electrically common with the drain of the second channel, the source of the second channel being the source of the triode, and the control gates of the first and second channels being common.

2. An insulated gate triode as defined in claim 1 wherein the width of the first channel is greater than the width of the second channel to produce the greater transconductance.

3. An insulated gate triode as defined in claim 1 wherein the length of the second channel is greater than the length of the first channel to produce the greater transconductance of the first channel.

4. A compound channel insulated gate triode comprising first, second and third spaced diffused regions in a semiconductor substrate forming first, second and third terminals respectively, first enhancement mode channel between the first and second diffused regions and a second enhancement mode channel between the second and third diffused regions and an electrically common gate electrode overlying both channels and separated from the first and second channels by first and second insulating layers respectively, the first channel having a greater transconductance than the second channel at a given gate voltage said greater transconductance being produced by the width to length ratio of the first channel being greater than the width to length ratio of the second channel.

5. An insulated gate triode as defined in claim 4 wherein the width of the first channel is greater than the width of the second channel to produce the greater transconductance.

6. An insulated gate triode as defined in claim 4 wherein the length of the second channel is greater than the length of the first channel to produce the greater transconductance of the first channel.

References Cited

UNITED STATES PATENTS 3,339,128 8/1967 Olmstead et al. ______ 317—235

OTHER REFERENCES

IBM Technical Disclosure Bulletin, "An AND Gate using single FET" by Brennemann et al., Vol. 7, No. 1, p. 7, June 1964.

JOHN W. HUCKERT, *Primary Examiner.*

JERRY D. CRAIG, *Assistant Examiner.*

U.S. Cl. X.R.

307—304

Notice of Adverse Decisions in Interferences

In Interference No. 97,185 involving Patent No. 3,436,622, R. M. Warner, Jr., COMPOUND CHANNEL INSULATED GATE TRIODE, final judgment adverse to the patentee was rendered Sept. 19, 1972, as to claims 1 to 6.

[*Official Gazette March 6, 1973.*]